(12) United States Patent
Fei et al.

(10) Patent No.: US 12,419,130 B2
(45) Date of Patent: Sep. 16, 2025

(54) METHOD FOR IMPROVING ALIGNMENT BETWEEN SELECTIVE EMITTER AND METAL PRINTING

(71) Applicants: ZHEJIANG JINKO SOLAR CO., LTD., Zhejiang (CN); JINKO SOLAR CO., LTD., Jiangxi (CN)

(72) Inventors: Zhiliang Fei, Zhejiang (CN); Ning Zhang, Zhejiang (CN); Yankai Qiu, Zhejiang (CN); Fangyan Luo, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 497 days.

(21) Appl. No.: 17/968,497

(22) Filed: Oct. 18, 2022

(65) Prior Publication Data

US 2024/0038923 A1   Feb. 1, 2024

(30) Foreign Application Priority Data

Jul. 27, 2022   (CN) .......................... 202210892920.3

(51) Int. Cl.
| H10F 71/00 | (2025.01) |
| H10F 10/00 | (2025.01) |
| H10F 77/70 | (2025.01) |

(52) U.S. Cl.
CPC ............. *H10F 71/00* (2025.01); *H10F 10/00* (2025.01); *H10F 77/703* (2025.01)

(58) Field of Classification Search
CPC ........ H10F 71/00; H10F 10/00; H10F 77/703; H10F 71/121; H10F 10/14; H10F 77/211;
(Continued)

(56) References Cited

U.S. PATENT DOCUMENTS

| 9,508,886 B2 * | 11/2016 | Rana ...................... B23K 26/40 |
| 2015/0364633 A1 | 12/2015 | Hosomi et al. |

(Continued)

FOREIGN PATENT DOCUMENTS

| CN | 206921831 U | * | 1/2018 | |
| CN | 109038866 A | * | 12/2018 | ............. H02J 50/30 |

(Continued)

OTHER PUBLICATIONS

Australian Office Action for App. No. 2022252768, dated Oct. 13, 2023 (11 pages).

(Continued)

*Primary Examiner* — Earl N Taylor
(74) *Attorney, Agent, or Firm* — NIXON PEABODY LLP; Jeffrey L. Costellia (57) ABSTRACT

A method for improving alignment between a selective emitters and metal printing, including: providing silicon wafer including first edge and midline parallel to the first edge; texturing and diffusing surface of the silicon wafer; and illuminating the surface of the silicon wafer by laser spots to form the SE. Multiple laser spots are arranged between the first edge and the midline to form spot rows, extension directions of the spot rows are parallel to the first edge, M spot rows are arranged and M is a positive integer and M>1. The M spot rows include N sub-spot regions, N is a positive integer and 1<N≤M, the sub-spot regions include at least one spot row, and areas of the laser spots in each sub-spot region are equal. The areas of the laser spots in different sub-spot regions from the midline pointing to the first edge gradually increases.

15 Claims, 5 Drawing Sheets

(58) Field of Classification Search
CPC ...... H10F 10/10; Y02P 70/50; H01L 31/1804; H01L 31/068; H01L 31/022425; H01L 31/186; H01L 31/02363; H01L 31/04
See application file for complete search history.

(56) References Cited

U.S. PATENT DOCUMENTS

| | | | | |
|---|---|---|---|---|
| 2016/0093763 | A1* | 3/2016 | Rana | B23K 26/18 438/57 |
| 2016/0233353 | A1* | 8/2016 | Tamura | H10F 71/121 |
| 2016/0329440 | A1* | 11/2016 | Turner | B23K 26/073 |
| 2017/0365734 | A1 | 12/2017 | Doll et al. | |

FOREIGN PATENT DOCUMENTS

| | | | | |
|---|---|---|---|---|
| CN | 109065658 | | 12/2018 | |
| CN | 109065658 | A * | 12/2018 | ......... H01L 31/0684 |
| CN | 110379884 | | 10/2019 | |
| CN | 110729381 | | 1/2020 | |
| CN | 111180530 | | 5/2020 | |
| CN | 111180530 | A * | 5/2020 | ..... H01L 31/022425 |
| CN | 112259621 | | 1/2021 | |
| CN | 112599639 | | 4/2021 | |
| CN | 112736146 | | 4/2021 | |
| CN | 214336726 | U | 10/2021 | |
| CN | 113782425 | | 12/2021 | |
| CN | 113903818 | | 1/2022 | |
| CN | 215771135 | U | 2/2022 | |
| CN | 114242812 | A | 3/2022 | |
| CN | 114393298 | | 4/2022 | |
| CN | 216488095 | | 5/2022 | |
| EP | 2441546 | A1 * | 4/2012 | ........... H01L 21/268 |
| JP | 2013-222961 | | 10/2013 | |
| JP | 2014-007188 | | 1/2014 | |
| JP | 2014-504026 | | 2/2014 | |
| JP | 2018-506180 | | 3/2018 | |
| WO | WO-2015/068247 | | 5/2015 | |
| WO | WO-2017/037803 | | 3/2017 | |

OTHER PUBLICATIONS

Japanese Office Action (Application No. 2022-167418) mailed Mar. 14, 2023, (8pgs).
Chinese Office Action for App. No. 2022108929203, mailed May 18, 2023 (8 pages).
Extended European Search Report for App. No. 22201297.3, mailed May 22, 2023, (72 pages).

* cited by examiner

METHOD FOR IMPROVING ALIGNMENT BETWEEN SELECTIVE EMITTER AND METAL PRINTING

CROSS-REFERENCE TO RELATED APPLICATIONS

The present application claims priority to Chinese Patent Application No. 202210892920.3, filed on Jul. 27, 2022, the content of which is incorporated herein by reference in its entirety.

TECHNICAL FIELD

The present disclosure relates to the technical field of solar cells, and in particular, to a method for improving alignment between a selective emitter (SE) and metal printing.

BACKGROUND

In recent years, with the decline of fossil fuels and their negative impact on environments, research and utilization of solar energy as pollution-free and renewable energy have been rapidly developed.

With the continuous development of the photovoltaic industry, a photovoltaic module has a greater demand for high-efficiency cells. In industrial production of the high-efficiency cells, an SE cell technology has been widely used. An SE cell has a structure featured with heavy doping in a screen metal electrode contact region and light doping in a screen metal electrode non-contact region by using lasers. The structure can reduce diffusion layer coincidence, improve a shortwave effect of optical fibers, and increase a short-circuit current and an open-circuit voltage.

In the manufacturing process of the SE cell, it is inevitable to balance alignment between laser spots and screen metal electrodes. For example, if the laser spots are larger, the heavily doped region is larger, so it is easier to align the metal electrodes with the light spots. However, excessively large laser spots may affect the open-circuit voltage of the SE cell and reduce power generation efficiency of the SE cell. If the laser spots are smaller, higher precision of the alignment between the metal electrodes and the laser spots is required.

Therefore, it is urgent to provide a method for improving alignment between an SE and metal printing.

SUMMARY

In view of the above, the present disclosure provides a method for improving alignment between an SE and metal printing, including: providing a silicon wafer including a first edge and a midline, the midline is parallel to the first edge; texturing and diffusing a surface of the silicon wafer; and illuminating the surface of the silicon wafer by laser spots to form the SE. A plurality of the laser spots are arranged along a first direction between the first edge and the midline to form spot rows, extension directions of the spot rows are parallel to an extension direction of the first edge, M spot rows are arranged along a second direction intersecting with the first direction, and M is a positive integer and M>1. The M spot rows include N sub-spot regions arranged along the second direction, N is a positive integer and $1 < N \leq M$, the sub-spot regions include at least one of the spot rows, and areas of the laser spots in each of the sub-spot regions are equal. The areas of the laser spots in different sub-spot regions along a direction from the midline pointing to the first edge gradually increases.

Other features of the present disclosure and advantages thereof will become clear from the following detailed description of exemplary embodiments of the present disclosure with reference to the accompanying drawings.

BRIEF DESCRIPTION OF DRAWINGS

The accompanying drawings, which are incorporated in and constitute a part of the specification, illustrate embodiments of the present disclosure and, together with the description, serve to explain the principles of the present disclosure.

DESCRIPTION OF EMBODIMENTS

Various exemplary embodiments of the present disclosure are now described in detail with reference to the accompanying drawings. It should be noted that, unless otherwise stated specifically, relative arrangement of the components and order of steps, the numerical expressions, and the values set forth in the embodiments are not intended to limit the scope of the present disclosure.

The following description of one or more exemplary embodiments is in fact merely illustrative, and shall not be construed as any limitations on the present disclosure and application or use thereof.

Technologies, methods, and devices known to those of ordinary skill in the related art may not be discussed in detail, but where appropriate, such technologies, methods, and devices should be considered as part of the specification. In all the examples shown and discussed herein, any specific value should be construed as merely illustrative and not as any limitation. Therefore, other examples of exemplary embodiments may have different values.

It should be noted that similar reference signs and letters denote similar terms in the accompanying drawings, and therefore, once an item is defined in a drawing, there is no need for further discussion in the accompanying drawings.

Figure 1:
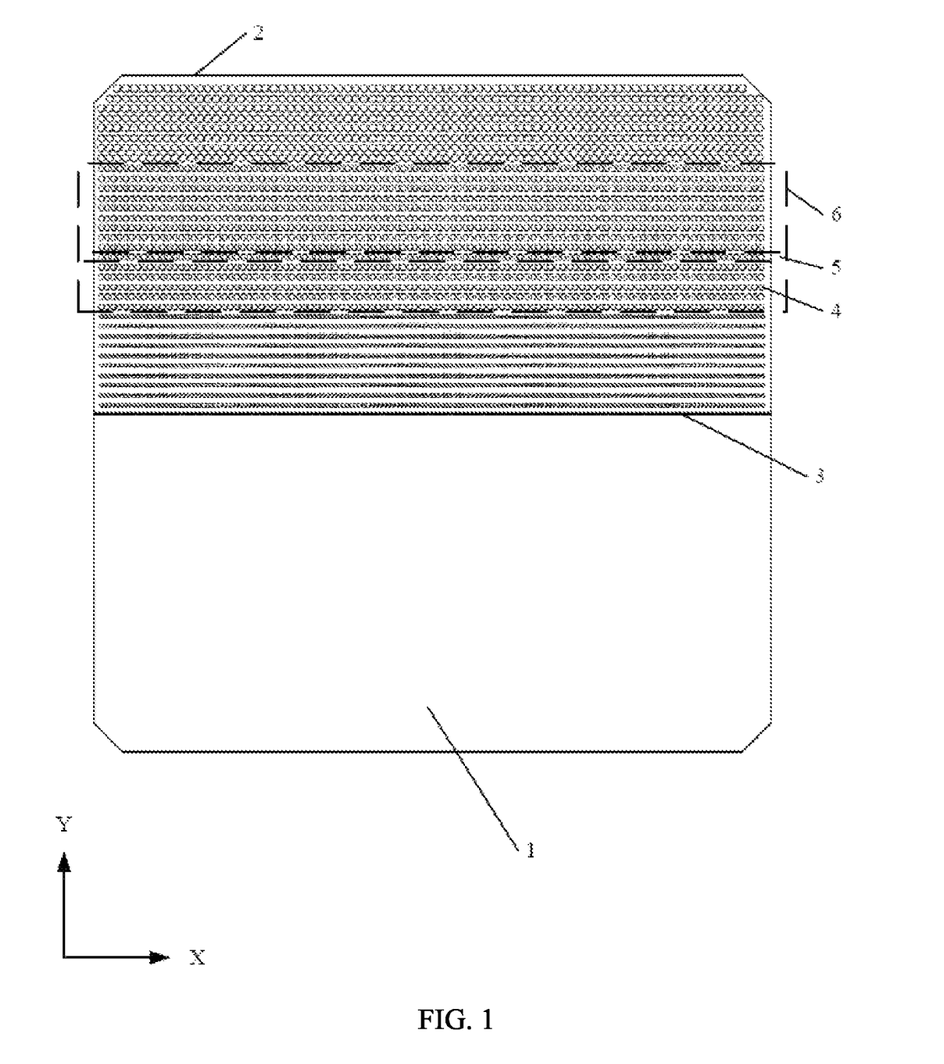
FIG. 1 shows a pattern of laser spots of an SE according to one or more embodiments of the present disclosure.
Figure 2:
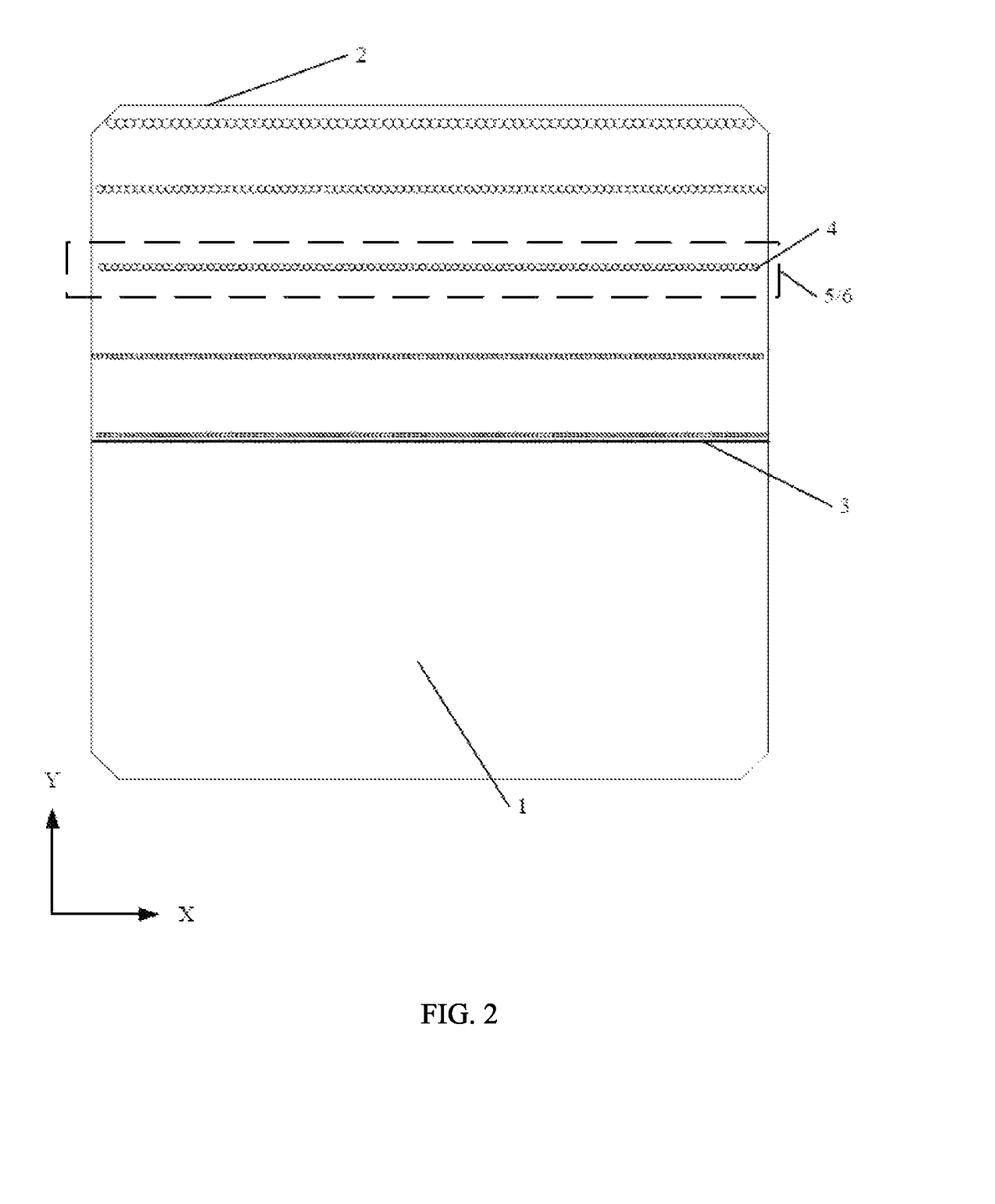
FIG. 2 shows a pattern of laser spots of another SE according to one or more embodiments of the present disclosure.

Referring to FIG. 1 and FIG. 2, FIG. 1 shows a pattern of laser spots of an SE according to one or more embodiments of the present disclosure, and FIG. 2 shows a pattern of laser spots of another SE according to one or more embodiments of the present disclosure, to describe a method for improving alignment between an SE and metal printing. The method includes: providing a silicon wafer 1, the silicon wafer 1 includes a first edge 2 and a midline 3, the midline 3 is parallel to the first edge 2; texturing and diffusing a surface of the silicon wafer 1; illuminating the surface of the silicon wafer 1 by laser spots 4 to form the selected emitter, between the first edge 2 and the midline 3, a plurality of the laser spots 4 is arranged along a first direction X to form spot rows 5, extension directions of the spot rows 5 are parallel to an extension direction of the first edge 2, M spot rows 5 are arranged along a second direction Y, M is a positive integer and M>1, the second direction Y intersects with the first direction X; the M spot rows 5 includes N sub-spot regions 6 arranged along the second direction, N is a positive integer and 1<N≤M, the sub-spot regions 6 includes at least one of the spot rows 5, and areas of the laser spots 4 in each of the sub-spot regions 6 are equal; and gradually increasing the areas of the laser spots 4 in different sub-spot regions 6 along a direction from the midline 3 pointing to the first edge 2.

It is to be noted that the midline 3 herein is not an actual line on the silicon wafer 1. The midline 3 is a dummy line. A silicon wafer 1 is provided, and the silicon wafer 1 may be monocrystalline silicon, polycrystalline silicon, or amorphous silicon. In some embodiments, monocrystalline silicon is adopted. The surface of the silicon wafer 1 is textured and diffused. Prior to the texturing, the surface of the silicon wafer 1 is cleaned to remove impurities from the surface of the silicon wafer 1. A pyramid structure is formed on the surface of the silicon wafer 1 during the texturing, so as to reduce reflectivity of the surface of the silicon wafer 1. The textured silicon wafer 1 is diffused to form a PN junction. The diffused silicon wafer 1 is heavily doped by using laser spots 4. Areas of the laser spots 4 determine the size of the SE.

It may be understood that, referring to FIG. 1 and FIG. 2, FIG. 1 and FIG. 2 illustrate only a pattern of laser spots 4 between the first edge 2 and the midline 3. In FIG. 1, each sub-spot region 6 includes at least two spot rows 5, and FIG. 2 only illustrates that each sub-spot region 6 includes only one spot row 5, which is not limited thereto. The number of the sub-spot region 6, the number of the spot row 5 included in the sub-spot region 6, the number of the laser spots 4 included in the spot row 5, an interval between two adjacent laser spots 4, a spacing between two adjacent spot rows 5, and a spacing between two adjacent sub-spot regions 6 in FIG. 1 and FIG. 2 are merely illustrative, and are not limited thereto. Alternatively, one part of the sub-spot regions 6 include only one spot row 5, while the other part of the sub-spot regions 6 include at least two spot rows 5, which is not limited in the present disclosure, provided that the areas of the laser spots 4 in different sub-spot regions 6 are gradually increased along the direction from the midline 3 pointing to the first edge 2. The closer to the edge position of the silicon wafer 1, the larger the area of the laser spot 4, which is helpful to realize accurate alignment between the metal electrode and the SE when the metal electrode deviates greatly.

Compared with the related art, the method for improving alignment between an SE and metal printing according to the present disclosure has at least the following advantages.

In the method for improving alignment between an SE and metal printing according to the present disclosure, between the first edge 2 and the midline 3, a plurality of the laser spots 4 are arranged along a first direction X to form spot rows 5, extension directions of the spot rows 5 are parallel to an extension direction of the first edge 2, M spot rows 5 are arranged along a second direction Y, where M is a positive integer and M>1, and the second direction Y intersects with the first direction X. The M spot rows 5 include N sub-spot regions 6 arranged along the second direction Y, where N is a positive integer and 1<N≤M. The sub-spot regions 6 include at least one of the spot rows 5, and areas of the laser spots 4 in each of the sub-spot regions 6 are equal. The areas of the laser spots 4 in different sub-spot regions 6 are gradually increased along a direction in which the midline 3 points to the first edge 2. The metal electrode is generally printed by a screen. Due to bonding of hot melt adhesive at edges of the screen and prolonging of the service life, the metal electrode at an edge position may deviate. That is, the position of the metal electrode at the edge changes greatly, while the position of the metal electrode in the middle changes little. Therefore, by designing the area of the laser spot 4 at a middle position to be small and the area of the laser spot 4 at an edge position to be large, contact resistance of contact between the silicon wafer 1 and the SE at the middle position can be reduced, a fill factor can be increased, and efficiency of a solar cell can be improved. Besides, when the service life of the screen is prolonged, the metal electrode at the edge position and the SE at the edge position are accurately aligned.

In some embodiments, still referring to FIG. 2, each sub-spot region 6 includes only one spot row 5.

It may be understood that each sub-spot region 6 includes only one spot row 5, areas of the laser spots 4 in each sub-spot region 6 are equal, and the areas of the laser spots 4 in different sub-spot regions 6 are gradually increased along a direction from the midline 3 pointing to the first edge 2. That is, the areas of the laser spots 4 of each spot row 5 are gradually increased along the direction from the midline 3 pointing to the first edge 2. The gradient areas of the laser spots 4 can further adapt to gradual deviation of the metal electrode and ensure accuracy of the alignment between the metal electrode and the SE, and can also ensure reduction of the contact resistance of the contact between the silicon wafer 1 and the SE at the middle position, increase of the fill factor, and thereby improving the efficiency of the solar cell.

In some embodiments, still referring to FIG. 1, each sub-spot region 6 includes at least two spot rows 5.

It may be understood that each sub-spot region 6 includes at least two spot rows 5, areas of the laser spots 4 in each sub-spot region 6 are equal, and the areas of the laser spots 4 in different sub-spot regions 6 are gradually increased along the direction from the midline 3 pointing to the first edge 2. That is, sizes of the laser spots 4 are designed regionally along the direction from the midline 3 pointing to the first edge 2, so as to more adapt to deviation of the metal electrode only at the edge position, which can ensure minimum contact resistance between the silicon wafer 1 and the SE at the middle position, thereby improving the efficiency of the solar cell.

Figure 3:
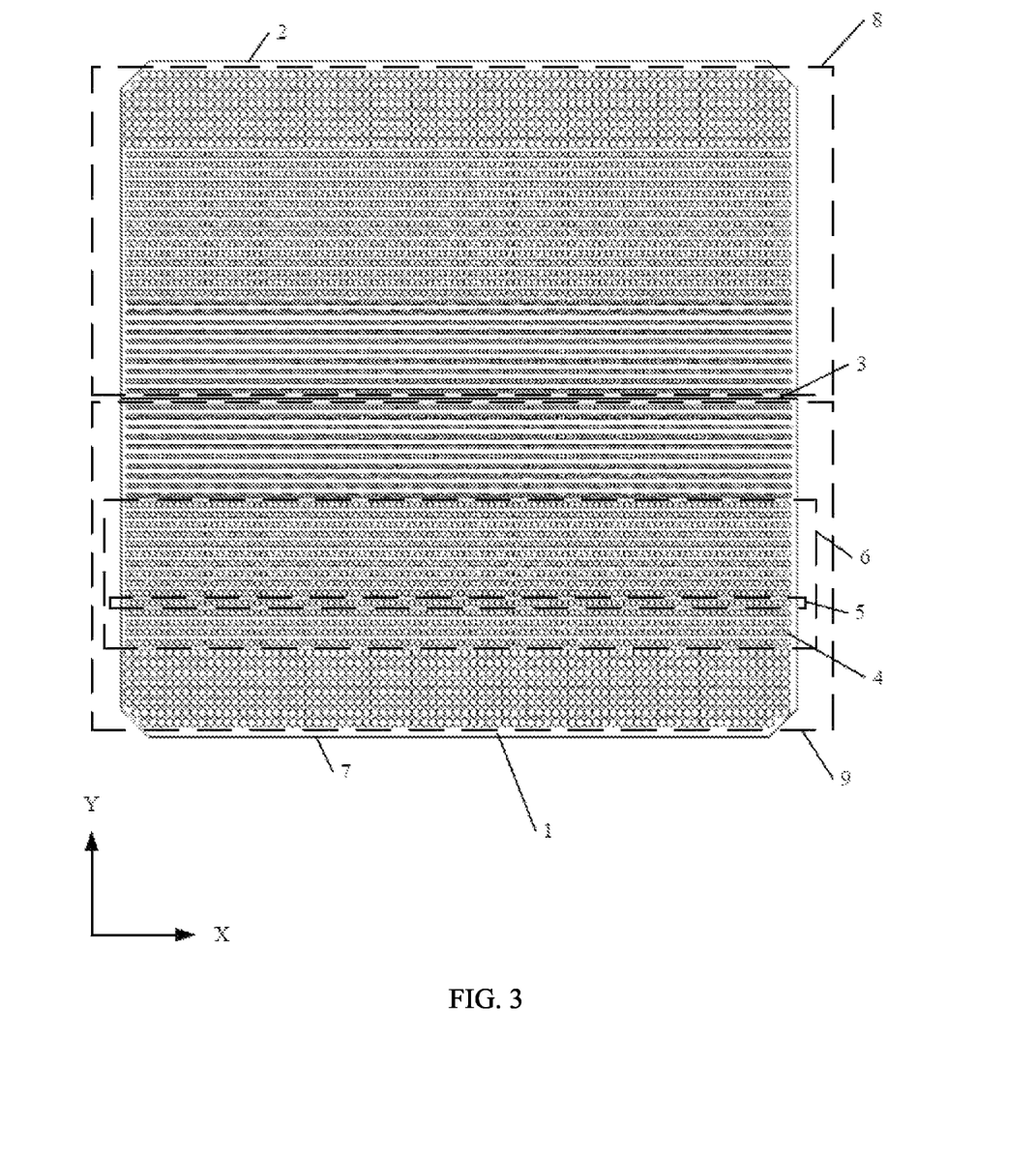
FIG. 3 shows a pattern of laser spots of yet another SE according to one or more embodiments of the present disclosure.
Figure 4:
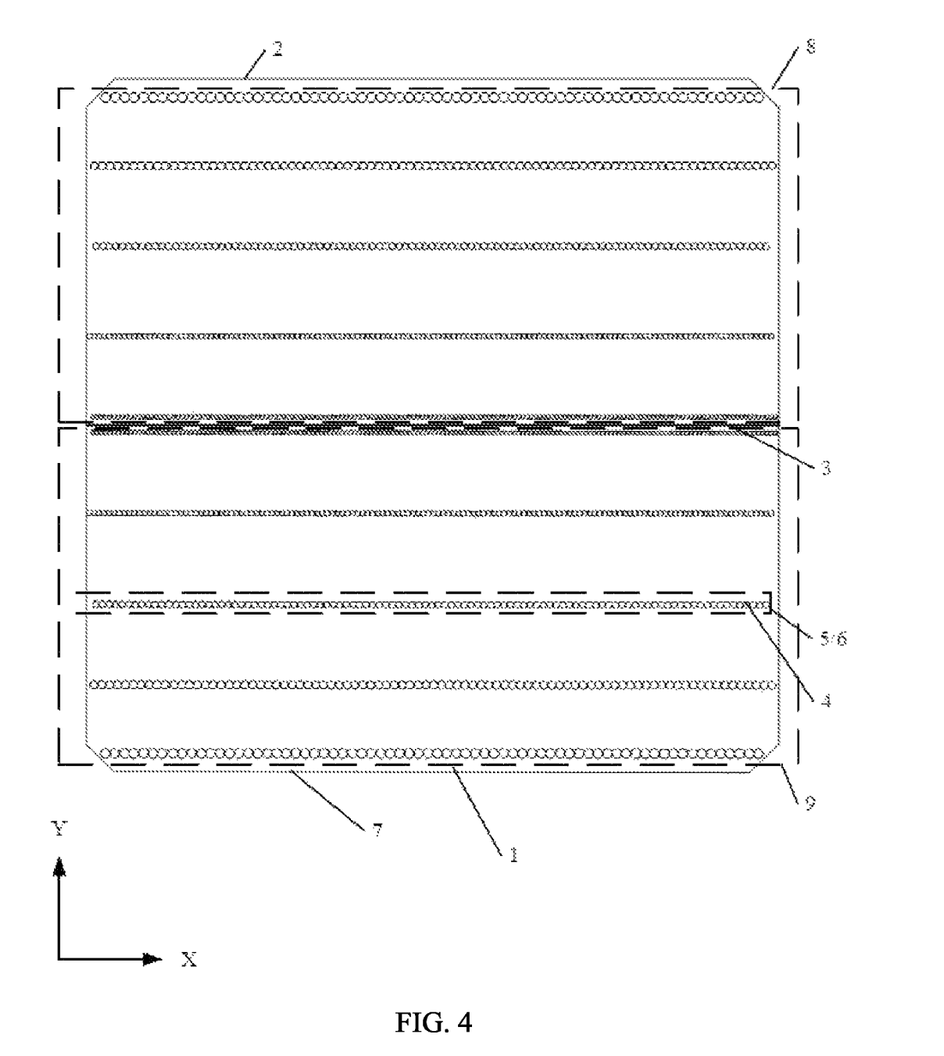
FIG. 4 shows a pattern of laser spots of still another SE according to one or more embodiments of the present disclosure.
Figure 5:
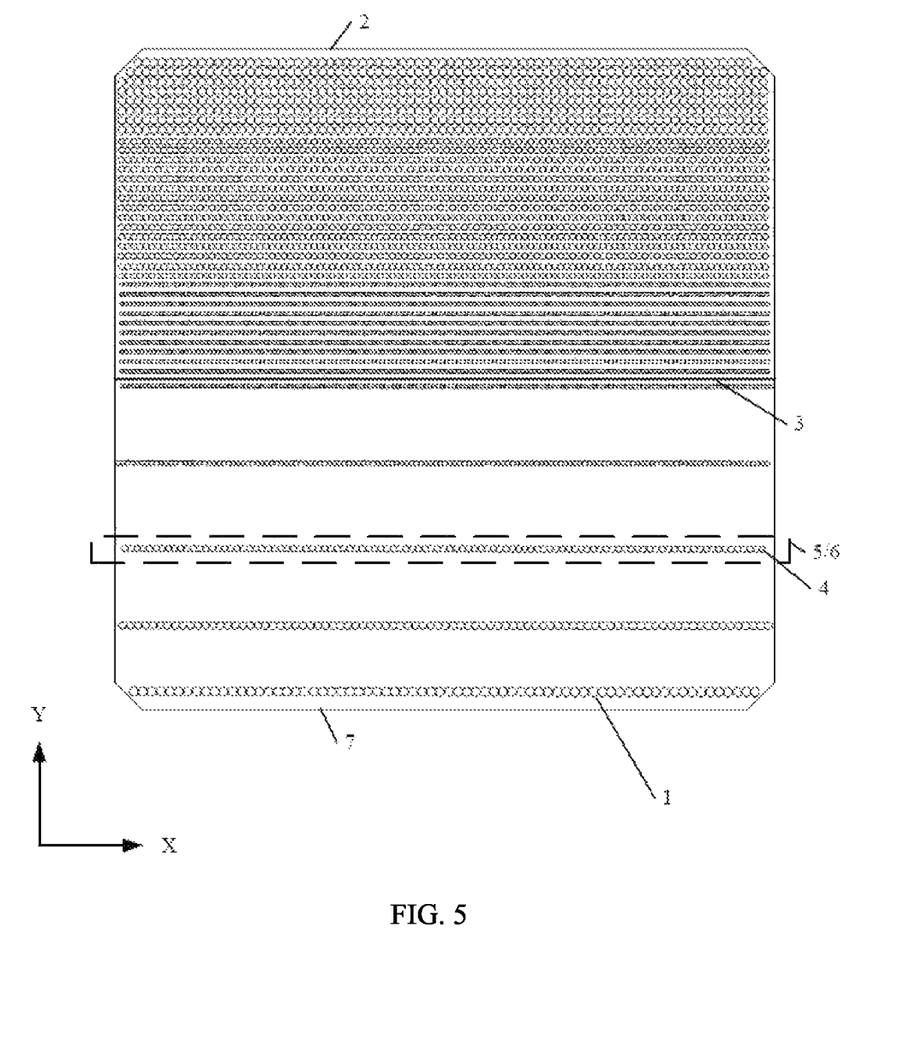
FIG. 5 shows a pattern of laser spots of a further SE according to one or more embodiments of the present disclosure.

In some embodiments, referring to FIG. 3, FIG. 4, and FIG. 5, FIG. 3 shows a pattern of laser spots of yet another SE according to one or more embodiments of the present disclosure, FIG. 4 shows a pattern of laser spots of still another SE according to one or more embodiments of the present disclosure, and FIG. 5 shows a pattern of laser spots of a further SE according to one or more embodiments of the present disclosure. The silicon wafer 1 further includes a second edge 7. The second edge 7 is arranged opposite to the first edge 2 along the second direction Y.

Between the second edge 7 and the midline 3, the plurality of laser spots 4 are arranged along the first direction X to form spot rows 5, and P spot rows 5 are arranged along the second direction Y, where P is a positive integer and P>1.

The P spot rows 5 include Q sub-spot regions 6 arranged along the second direction Y, where Q is a positive integer and 1<Q≤P, the sub-spot regions 6 include at least one of the spot rows 5, and areas of the laser spots 4 in each of the sub-spot regions 6 are equal.

The areas of the laser spots 4 in the sub-spot regions 6 are gradually increased along a direction from the midline 3 pointing to the second edge 7.

It may be understood that FIG. 3 only illustrates that each sub-spot region 6 includes at least two spot rows 5 between the second edge 7 and the midline 3, and FIG. 4 and FIG. 5 only illustrate that each sub-spot region includes only one spot row 5 between the second edge 7 and the midline 3. That is, a pattern of the laser spots 4 between the first edge 2 and the midline 3 is different from a pattern of the laser spots 4 between the second edge 7 and the midline 3, which is not limited thereto. Alternatively, between the second edge 7 and the midline 3, one part of the sub-spot regions 6 include only one spot row 5, while the other part of the sub-spot regions 6 include at least two spot rows 5, which is not limited in the present disclosure. The areas of the laser spots 4 in the sub-spot regions 6 are gradually increased along the direction from the midline 3 pointing to the first edge 2, and the areas of the laser spots 4 in the sub-spot regions 6 are gradually increased along the direction from the midline 3 pointing to the second edge 7. When the metal electrodes at the first edge 2 and the second edge 7 both deviate, the metal electrodes at the first edge 2 and the second edge 7 can accurately contact the SE, while the center of the silicon wafer 1 maintains small contact resistance with the SE.

In some embodiments, still referring to FIG. 3 and FIG. 4, the laser spots 4 between the midline 3 and the first edge 2 form a first spot region 8, the laser spots 4 between the midline 3 and the second edge 7 form a second spot region 9, and the first spot region 8 and the second spot region 9 are symmetric along the midline 3.

It may be understood that, since the silicon wafer 1 is symmetric along the midline 3, the symmetry of the first spot region 8 and the second spot region 9 along the midline 3 is more reasonable, brings a better alignment effect, and achieves higher efficiency of the solar cell.

In some embodiments, still referring to FIG. 1 to FIG. 5, the laser spots 4 are circular.

It may be understood that orthographic projections of the laser spots 4 on the silicon wafer 1 are circular, and the areas of the laser spots 4 can be changed by changing diameters of the laser spots 4.

In some embodiments, the laser spots 4 may also be rectangular, equilaterally polygonal, or the like. When the laser spots 4 are oblong, lengths and widths of the laser spots 4 can be increased simultaneously to increase the areas of the laser spots 4. The lengths and the widths of the laser spots 4 have a linear relationship.

In some embodiments, printing speeds of lasers on the silicon wafer 1, laser power, laser frequencies, and focal lengths of a lens through which the lasers are emitted are adjusted to adjust the diameters of the laser spots 4.

It may be understood that the sizes of the laser spots 4 may be changed by changing relative positions of lenses in a device from which the lasers are emitted, or by cooperatively adjusting printing speeds, laser power, laser frequencies, and focal lengths of lenses through which the lasers are emitted. The focal lengths of the lenses through which the lasers are emitted may be adjusted by shifting positions of the lenses through which the lasers are emitted to change positions of focuses.

In some embodiments, for the laser spot 4 far from the midline 3, the printing speed ranges from 20000 mm/s to 24000 mm/s, the laser power ranges from 29 W to 31 W, the laser frequency ranges from 230 KHZ to 270 KHZ, and the focal length ranges from 30000 mm to 38000 mm.

It may be understood that, by setting the above parameters, the diameters of the laser spots 4 may be increased. That is, the laser spots 4 may be formed near the first edge 2 and/or the second edge 7 by using the above parameters.

In some embodiments, for the laser spot 4 close to the midline 3, the printing speed ranges from 20000 mm/s to 24000 mm/s, the laser power ranges from 28 W to 30 W, the laser frequency ranges from 270 KHZ to 330 KHZ, and the focal length ranges from 28000 mm to 35000 mm.

It may be understood that, by setting the above parameters, the diameters of the laser spots 4 formed are small. That is, the laser spots 4 may be formed near the midline 3 by using the above parameters.

In some embodiments, the diameters of the laser spots 4 range from 35 μm to 130 μm.

It may be understood that, the diameters of the laser spots 4 constantly increase along the midline 3 toward the first edge 2 and/or the second edge 7. That is, the diameters of the laser spots 4 near the midline 3 are 35 μm, and the diameters of the laser spots 4 near the first edge 2 and/or the second edge 7 are 130 μm.

In some embodiments, the diameters of the laser spots 4 near the midline 3 range from 50 μm to 60 μm, and the diameters of the laser spots 4 near the first edge 2 and/or the second edge 7 range from 85 μm to 100 μm.

As can be known from the above embodiments, the method for improving alignment between an SE and metal printing according to the present disclosure achieves at least the following beneficial effects.

In the method for improving alignment between an SE and metal printing according to the present disclosure, between the first edge and the midline, a plurality of the laser spots are arranged along a first direction to form spot rows, extension directions of the spot rows are parallel to an extension direction of the first edge, M spot rows are arranged along a second direction, where M is a positive integer and M>1, and the second direction intersects with the first direction. The M spot rows include N sub-spot regions arranged along the second direction, where N is a positive integer and 1<N≤M, the sub-spot regions include at least one of the spot rows, and areas of the laser spots in each of the sub-spot regions are equal. The areas of the laser spots in different sub-spot regions are gradually increased along a direction in which the midline points to the first edge. The metal electrode is generally printed by a screen. Due to bonding of hot melt adhesive at edges of the screen and prolonging of the service life, the metal electrode at an edge position may deviate. That is, the position of the metal electrode at the edge changes greatly, while the position of the metal electrode in the middle changes little. Therefore, by designing the area of the laser spot at a middle position to be small and the area of the laser spot at an edge position to be large, contact resistance of contact between the silicon wafer and the SE at the middle position can be reduced, the fill factor can be increased, and efficiency of a solar cell can be improved. Besides, when the service life of the screen is prolonged, the metal electrode at the edge position and the SE at the edge position are accurately aligned.

Although some specific embodiments of the present disclosure have been described in detail through examples, it should be understood by those skilled in the art that the above examples are for illustrative purposes only and not intended to limit the scope of the present disclosure. It should be understood by those skilled in the art that the above embodiments can be modified without departing from the scope and spirit of the disclosure. The scope of the present disclosure is defined by the appended claims.

What is claimed is:

1. A method for improving alignment between a selective emitter (SE) and metal printing, comprising:
providing a silicon wafer comprising a first edge and a midline, wherein the midline is parallel to the first edge;
texturing and diffusing a surface of the silicon wafer; and
illuminating the surface of the silicon wafer by laser spots to form the SE,
wherein a plurality of the laser spots are arranged along a first direction between the first edge and the midline to form spot rows, extension directions of the spot rows are parallel to an extension direction of the first edge, M spot rows are arranged along a second direction intersecting with the first direction, and M is a positive integer and M>1;
the M spot rows comprise N sub-spot regions arranged along the second direction, N is a positive integer and 1<N≤M, the sub-spot regions comprise at least one of the spot rows, and areas of the laser spots in a same one of the sub-spot regions are equal, and areas of the laser spots in different sub-spot regions are different from each other; and
the areas of the laser spots in different sub-spot regions along a direction from the midline pointing to the first edge gradually increases.

2. The method for improving alignment between an SE and metal printing according to claim 1, wherein each of the sub-spot regions comprises only one of the spot rows.

3. The method for improving alignment between an SE and metal printing according to claim 1, wherein each of the sub-spot regions comprises at least two of the spot rows.

4. The method for improving alignment between an SE and metal printing according to claim 1, wherein the silicon wafer further comprises a second edge arranged opposite to the first edge along the second direction;
wherein the plurality of laser spots are arranged along the first direction between the second edge and the midline to form spot rows, P spot rows are arranged along the second direction, and P is a positive integer and P>1;
the P spot rows comprise Q sub-spot regions arranged along the second direction, Q is a positive integer and 1<Q≤P, the sub-spot regions comprise at least one of the spot rows, and areas of the laser spots in each of the sub-spot regions are equal; and
the areas of the laser spots in the sub-spot regions along a direction from the midline pointing to the second edge gradually increases.

5. The method for improving alignment between an SE and metal printing according to claim 4, wherein the laser spots between the midline and the first edge form a first spot region, the laser spots between the midline and the second edge form a second spot region, and the first spot region and the second spot region are symmetric along the midline.

6. The method for improving alignment between an SE and metal printing according to claim 1, wherein the laser spots have a circular shape.

7. The method for improving alignment between an SE and metal printing according to claim 6, wherein printing speeds of lasers on the silicon wafer, laser power, laser frequencies, and focal lengths of a lens through which the lasers are emitted are adjusted to adjust diameters of the laser spots.

8. The method for improving alignment between an SE and metal printing according to claim 7, wherein, for the laser spot far from the midline, the printing speed ranges from 20000 mm/s to 24000 mm/s, the laser power ranges from 29 W to 31 W, the laser frequency ranges from 230 KHZ to 270 KHZ, and the focal length ranges from 30000 mm to 38000 mm.

9. The method for improving alignment between an SE and metal printing according to claim 7, wherein, for the laser spot close to the midline, the printing speed ranges from 20000 mm/s to 24000 mm/s, the laser power ranges from 28 W to 30 W, the laser frequency ranges from 270 KHZ to 330 KHZ, and the focal length ranges from 28000 mm to 35000 mm.

10. The method for improving alignment between an SE and metal printing according to claim 6, wherein the diameters of the laser spots range from 35 μm to 130 μm.

11. The method for improving alignment between an SE and metal printing according to claim 10, wherein the diameters of the laser spots adjacent to the midline range from 50 μm to 60 μm.

12. The method for improving alignment between an SE and metal printing according to claim 10, wherein the diameters of the laser spots adjacent to the first edge and/or the second edge range from 85 μm to 100 μm.

13. The method for improving alignment between an SE and metal printing according to claim 1, wherein the laser spots have a rectangular shape or a polygonal shape.

14. The method for improving alignment between an SE and metal printing according to claim 1, further comprising:
forming a pyramid structure on a surface of the silicon wafer during the texturing.

15. The method for improving alignment between an SE and metal printing according to claim 1, wherein the silicon wafer is monocrystalline silicon, polycrystalline silicon, or amorphous silicon.

* * * * *